US012642035B2

(12) United States Patent
Obaru

(10) Patent No.: US 12,642,035 B2
(45) Date of Patent: May 26, 2026

(54) SUBSTRATE LIQUID PROCESSING APPARATUS AND SUBSTRATE LIQUID PROCESSING METHOD

(71) Applicant: Tokyo Electron Limited, Tokyo (JP)

(72) Inventor: Takanori Obaru, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 119 days.

(21) Appl. No.: 18/573,615

(22) PCT Filed: Jun. 14, 2022

(86) PCT No.: PCT/JP2022/023762
§ 371 (c)(1),
(2) Date: Dec. 22, 2023

(87) PCT Pub. No.: WO2022/270351
PCT Pub. Date: Dec. 29, 2022

(65) Prior Publication Data
US 2024/0321600 A1 Sep. 26, 2024

(30) Foreign Application Priority Data
Jun. 24, 2021 (JP) ................................ 2021-105153

(51) Int. Cl.
*H01L 21/67* (2006.01)
*H10P 72/00* (2026.01)
*H10P 72/76* (2026.01)

(52) U.S. Cl.
CPC ...... *H10P 72/0414* (2026.01); *H10P 72/0604* (2026.01); *H10P 72/7618* (2026.01)

(58) Field of Classification Search
None
See application file for complete search history.

(56) References Cited

U.S. PATENT DOCUMENTS

2003/0079764 A1 5/2003 Hirose et al.
2015/0303078 A1 10/2015 Ishibashi

FOREIGN PATENT DOCUMENTS

JP 2003-203892 A 7/2003
JP 2006-086415 A 3/2006
(Continued)

OTHER PUBLICATIONS

Google Patents translation of JP2006086415A (Year: 2025).*
International Search Report for PCT/JP2022/023762 dated Sep. 20, 2022, 4 pages.

*Primary Examiner* — Eric W Golightly
(74) *Attorney, Agent, or Firm* — Chrisman Gallo Tochtrop LLC

(57) ABSTRACT

A substrate liquid processing apparatus includes a substrate holder configured to hold a substrate; a rotational driver configured to rotate the substrate; a liquid discharger having a liquid supply nozzle configured to discharge a liquid toward a processing surface of the substrate; a processing liquid discharger having a processing liquid supply nozzle configured to discharge a processing liquid in a form of mist toward the processing surface; a first driver configured to move the processing liquid supply nozzle; and a controller. The controller controls the processing liquid discharger and the first driver to allow a landing position of the processing liquid on the processing surface on which a liquid film containing the liquid is formed to be moved from an outer peripheral portion of the processing surface toward a central portion thereof while controlling the liquid discharger to discharge the liquid toward the processing surface of the substrate.

17 Claims, 12 Drawing Sheets

(56)        References Cited

FOREIGN PATENT DOCUMENTS

| JP | 2014-179566 | A | 9/2014 |
| JP | 2021-057503 | A | 4/2021 |
| TW | 561516 | B | 11/2003 |
| TW | 10-2014-0113511 | A | 9/2014 |

* cited by examiner

FIG. 2
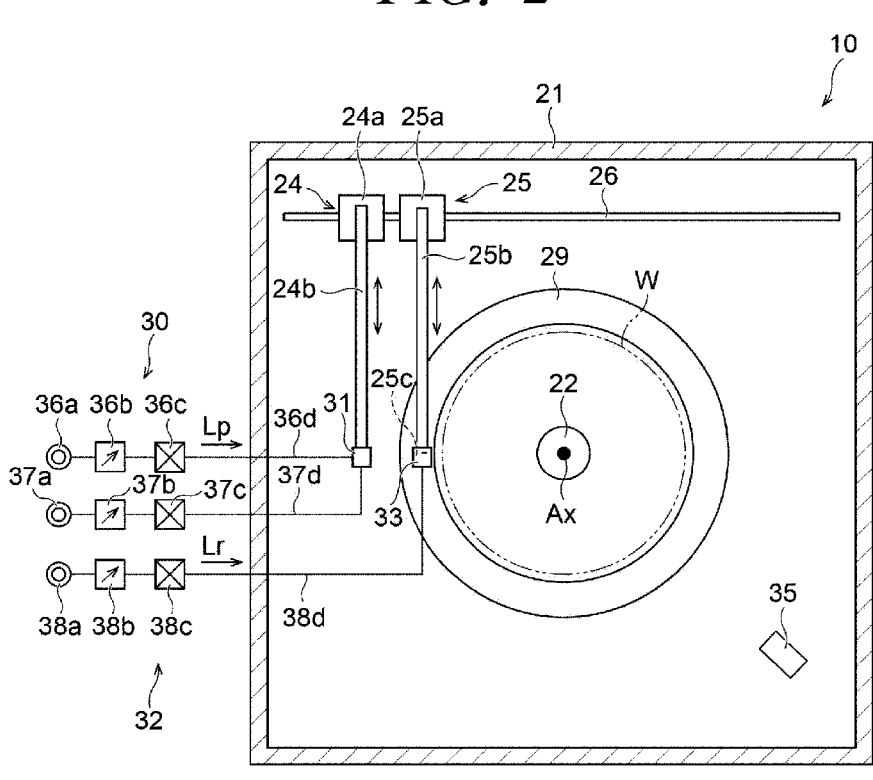
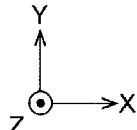

Figure 11:
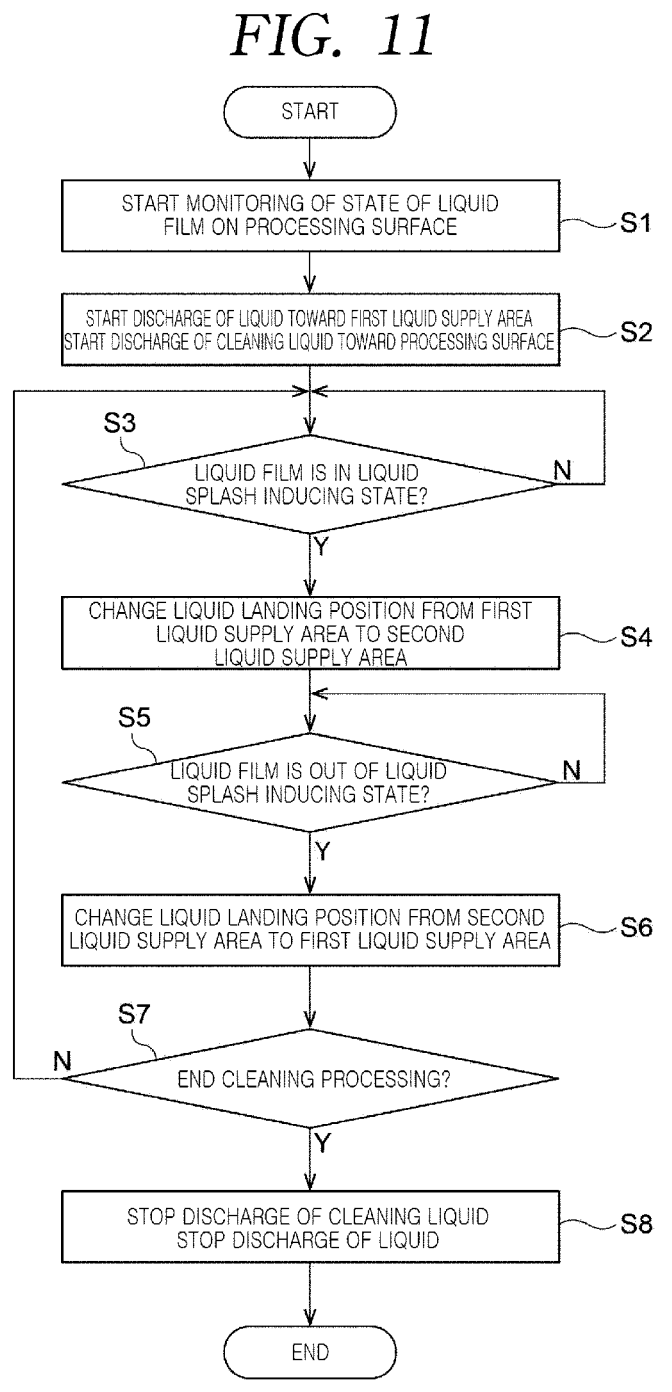

START

START MONITORING OF STATE OF LIQUID
FILM ON PROCESSING SURFACE ——S1

START DISCHARGE OF LIQUID TOWARD FIRST LIQUID SUPPLY AREA
START DISCHARGE OF CLEANING LIQUID TOWARD PROCESSING SURFACE ——S2

S3

LIQUID FILM IS IN LIQUID
SPLASH INDUCING STATE? —— N

Y

CHANGE LIQUID LANDING POSITION FROM FIRST
LIQUID SUPPLY AREA TO SECOND
LIQUID SUPPLY AREA ——S4

S5

LIQUID FILM IS OUT OF LIQUID
SPLASH INDUCING STATE? —— N

Y

CHANGE LIQUID LANDING POSITION FROM SECOND
LIQUID SUPPLY AREA TO FIRST LIQUID SUPPLY AREA ——S6

S7

N —— END CLEANING PROCESSING?

Y

STOP DISCHARGE OF CLEANING LIQUID
STOP DISCHARGE OF LIQUID ——S8

END

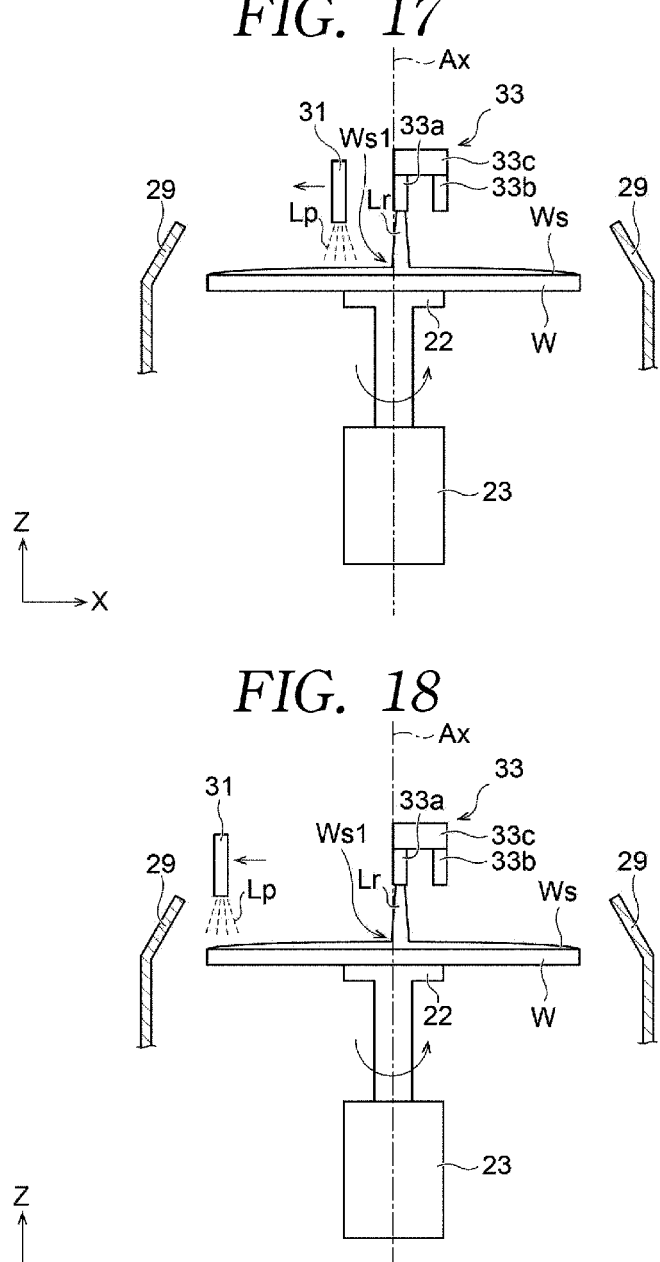

SUBSTRATE LIQUID PROCESSING APPARATUS AND SUBSTRATE LIQUID PROCESSING METHOD

CROSS-REFERENCE TO RELATED APPLICATIONS

This Application is a U.S. national phase application under 35 U.S.C. § 371 of PCT Application No. PCT/JP2022/023762 filed on Jun. 14, 2022, which claims the benefit of Japanese Patent Application No. 2021-105153 filed on Jun. 24, 2021, the entire disclosures of which are incorporated herein by reference.

TECHNICAL FIELD

The various aspects and embodiments described herein pertain generally to a substrate liquid processing apparatus and a substrate liquid processing method.

BACKGROUND

In the manufacture of a semiconductor device, it is required to maintain a high level of cleanliness of a front surface and a rear surface of a semiconductor wafer (hereinafter, simply referred to as "wafer"), especially the front surface on which the semiconductor device is to be formed. In order to maintain the high level of cleanliness of the wafer, the wafer is cleaned before and after various manufacturing processes.

In the cleaning of the wafer, by spraying a mixed fluid of a gas and a liquid onto the front surface of the wafer, particles can be effectively removed from the front surface of the wafer.

A substrate cleaning apparatus described in Patent Document 1 discharges a cleaning liquid such as a two-fluid toward the front surface of the substrate in the state that a liquid film is formed on the front surface of the substrate. Accordingly, the cleaning liquid in the form of mist that has splashed back from the inside of a cup is suppressed from directly adhering to the front surface of the substrate, so that adhesion of particles to the front surface of the substrate is suppressed.

Patent Document 1: Japanese Patent Laid-open Publication No. 2003-203892

SUMMARY

As described above, when a processing liquid such as a cleaning liquid is discharged toward a surface of a substrate (wafer) covered with a liquid, the processing liquid may collide with the liquid on the substrate, causing a liquid splash. The liquid scattered from the substrate due to this liquid splash (that is, the scattered liquid containing the liquid and/or the processing liquid) may splash back from a peripheral member such as a cup disposed around the substrate, ending up landing on the substrate. The scattered liquid that has landed on the substrate in this way may cause a particle on the substrate.

Further, when discharging the processing liquid toward the front surface of the substrate, by reducing the amount of the liquid on the surface of the substrate, the thickness of the liquid film may be reduced, making it difficult for the liquid splash to occur. If, however, the amount of the liquid on the substrate is small, it becomes easy for a particle to adhere to the substrate. For this reason, by suppressing the occurrence of the liquid splash while discharging the processing liquid toward the front surface of the substrate covered with a sufficient amount of the liquid, it is possible to suppress the adhesion of the particle to the substrate more effectively.

Exemplary embodiments provide an advantageous technique of suppressing the adhesion of the particle to the substrate.

In an exemplary embodiment, a substrate liquid processing apparatus includes a substrate holder configured to hold a substrate; a rotational driver configured to rotate the substrate held by the substrate holder; a liquid discharger having a liquid supply nozzle configured to discharge a liquid toward a processing surface of the substrate; a processing liquid discharger having a processing liquid supply nozzle configured to discharge a processing liquid in a form of mist toward the processing surface; a first driver configured to move the processing liquid supply nozzle; and a controller configured to control the processing liquid discharger, the first driver, and the liquid discharger. The controller controls the processing liquid discharger and the first driver to allow a landing position of the processing liquid from the processing liquid supply nozzle on the processing surface on which a liquid film containing the liquid is formed to be moved from an outer peripheral portion of the processing surface toward a central portion thereof while controlling the liquid discharger to discharge the liquid from the liquid supply nozzle toward the processing surface of the substrate being rotated.

According to the exemplary embodiment, it is possible to provide the technique advantageous to suppress the adhesion of the particle to the substrate.

BRIEF DESCRIPTION OF THE DRAWINGS

FIG. 2 is a diagram schematically illustrating an example of a processing device according to a first exemplary embodiment.

FIG. 10 is a diagram illustrating an example in which a liquid supply nozzle is driven to change a landing position of the rinse liquid on the processing surface.

FIG. 11 is a flowchart illustrating an example of changing the landing position of the rinse liquid on the processing surface by using a monitoring result of a monitoring device.

FIG. 17 is a diagram illustrating an example of the substrate liquid processing method according to the second exemplary embodiment.

FIG. 18 is a diagram illustrating an example of the substrate liquid processing method according to the second exemplary embodiment.

DETAILED DESCRIPTION

Hereinafter, exemplary embodiments of the present disclosure will be described with reference to the accompanying drawings.

Figure 1:
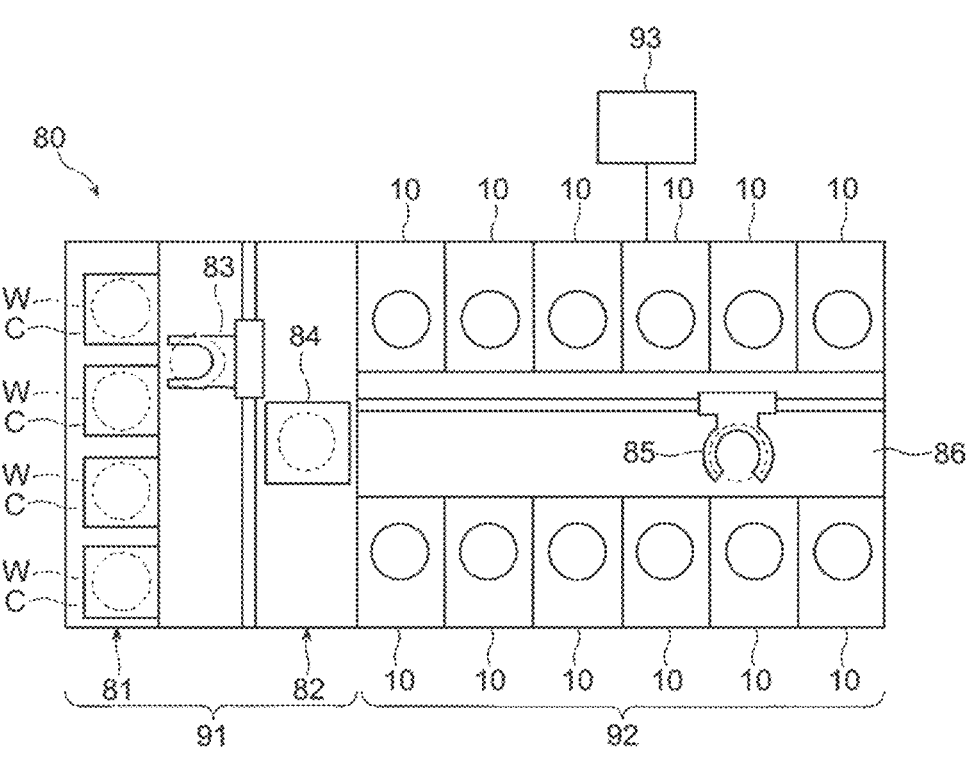
FIG. 1 is a diagram schematically illustrating an example of a processing system.

FIG. 1 is a diagram schematically illustrating an example of a processing system 80.

The processing system 80 shown in FIG. 1 has a carry-in/out station 91 and a processing station 92. The carry-in/out station 91 includes a placing table 81 placing thereon a plurality of carriers C, and a transfer device 82 equipped with a first transfer mechanism 83 and a delivery module 84. Each carrier C accommodates therein a plurality of substrates W horizontally. The processing station 92 is provided with a plurality of processing devices 10 arranged on both sides of a transfer path 86, and a second transfer mechanism 85 configured to be moved back and forth along the transfer path 86.

The substrate W is taken out from the carrier C and transferred in the delivery module 84 by the first transfer mechanism 83, and then taken out from the delivery module 84 by the second transfer mechanism 85. Then, the substrate W is carried into the corresponding processing device 10 by the second transfer mechanism 85 to be subjected to a preset liquid processing in the corresponding processing device 10. Afterwards, the substrate W is taken out from the corresponding processing device 10 and transferred in the delivery module 84 by the second transfer mechanism 85, and then returned back into the carrier C of the placing table 81 by the first transfer mechanism 83.

The processing system 80 is equipped with a controller 93. The controller 93 is implemented by, for example, a computer, and includes an operation processor and a storage. The storage of the controller 93 stores therein a program and data for various processings performed in the processing system 80. The operation processor of the controller 93 appropriately reads and executes the program stored in the storage, thus controlling various types of devices of the processing system 80 to perform the various processings.

The program and the data stored in the storage of the controller 93 may have been recorded on a computer-readable recording medium and may be installed from the recording medium into the storage. The computer-readable recording medium may be, by way of non-limiting example, a hard disk (HD), a flexible disk (FD), a compact disk (CD), a magnet optical disk (MO), a memory card, or the like.

In the processing system 80 described above, two or more of the plurality of processing devices 10 may have the same configuration and perform the same processing, or may have different configurations and perform different processings. In each processing device 10, it is possible to perform various liquid processings by applying various kinds of processing liquids (for example, a chemical liquid, a rinse liquid, and a cleaning liquid) to the substrate W. In each processing device 10, multiple types of liquid processings (for example, a chemical liquid processing, a rinsing processing, and a cleaning processing) for the substrate W may be performed in a single processing tub or in different processing tubs.

Hereinafter, a cleaning processing for the substrate W performed in one or more processing devices 10 will be described as an example. Further, the substrate W is typically made of a semiconductor wafer or a glass substrate, but is not limited thereto.

First Exemplary Embodiment

FIG. 2 is a diagram schematically illustrating an example of the processing device 10 according to a first exemplary embodiment. FIG. 2 shows various components inside a processing tub 21 seen from above.

The processing device 10 shown in FIG. 2 includes a substrate holder 22, a liquid discharger 32, a cleaning liquid discharger (processing liquid discharger) 30, a first driver 24, and a second driver 25.

The substrate holder 22 holds the substrate W in an internal space of the processing tub 21. The substrate holder 22 shown in FIG. 2 attracts and holds a bottom surface (particularly, a central portion thereof) of the substrate W. However, a specific way to hold the substrate W by the substrate holder 22 is not particularly limited.

The substrate holder 22 is configured to be rotated about a rotation axis Ax along with the substrate W while holding the substrate W. The substrate holder 22 is rotated by a rotational driver 23 (see FIG. 3) composed of a motor or the like. That is, the rotational driver 23 rotates the substrate W held by the substrate holder 22 about the rotation axis Ax under the control of the controller 93 (see FIG. 1).

The liquid discharger 32 has a liquid source 38a, a flow rate controller 38b, an opening/closing valve 38c, a supply line 38d, and a liquid supply nozzle 33.

The liquid source 38a sends a rinse liquid Lr (for example, deionized water (DIW)) to the supply line 38d under the control of the controller 93. The flow rate controller 38b is provided in a portion of the supply line 38d between the liquid source 38a and the opening/closing valve 38c to adjust, under the control of the controller 93, the flow rate of the rinse liquid Lr flowing through the supply line 38d. The opening/closing valve 38c is provided in a portion of the supply line 38d between the flow rate controller 38b and the liquid supply nozzle 33 to open or close a flow path of the supply line 38d under the control of the controller 93.

The liquid supply nozzle 33 discharges the rinse liquid Lr that is supplied from the liquid source 38a through the supply line 38d.

The cleaning liquid discharger 30 includes a processing liquid source 36a, a flow rate controller 36b, an opening/closing valve 36c, a supply line 36d, a gas source 37a, a flow rate controller 37b, an opening/closing valve 37c, a supply line 37d, and a cleaning liquid supply nozzle 31.

The processing liquid source 36a sends a cleaning liquid (a processing liquid; for example, DIW) Lp to the supply line 36d under the control of the controller 93. The flow rate controller 36b is provided in a portion of the supply line 36d between the processing liquid source 36a and the opening/closing valve 36c to adjust, under the control of the controller 93, the flow rate of the cleaning liquid Lp flowing through the supply line 36d. The opening/closing valve 36c is provided in a portion of the supply line 36d between the flow rate controller 36b and the cleaning liquid supply nozzle 31 to open or close a flow path of the supply line 36d under the control of the controller 93.

The gas source 37a sends a gas (for example, an inert gas such as nitrogen) to the supply line 37d under the control of the controller 93. The flow rate controller 37b is provided in a portion of the supply line 37d between the gas source 37a and the opening/closing valve 37c to adjust the flow rate of the gas flowing through the supply line 37d under the control of the controller 93. The opening/closing valve 37c is provided in a portion of the supply line 37d between the flow rate controller 37b and the cleaning liquid supply nozzle 31 to open or close a flow path of the supply line 37d under the control of the controller 93.

The cleaning liquid supply nozzle 31 discharges the cleaning liquid Lp supplied from the processing liquid source 36a through the supply line 36d and the gas supplied from the gas source 37a through the supply line 37d. In this way, the cleaning liquid supply nozzle 31 of the present exemplary embodiment is configured as a two-fluid nozzle configured to discharge the gas (inert gas, etc.) together with the cleaning liquid (processing liquid) Lp, and discharge the cleaning liquid Lp in the form of mist.

The cleaning liquid supply nozzle 31 is movably supported by the first driver 24. The liquid supply nozzle 33 is movably supported by the second driver 25.

The first driver 24 has a first driving body 24a and a first driving arm 24b. The second driver 25 has a second driving body 25a and a second driving arm 25b.

The first driving body 24a and the second driving body 25a are moved along a guide rail 26 linearly extending in a horizontal direction (that is, the X-axis direction) under the control of the controller 93. The guide rail 26 is disposed in and fixed to the processing tub 21. Each of the first driving arm 24b and the second driving arm 25b is configured to be linearly extensible/contractible in a horizontal direction (i.e., the Y-axis direction perpendicular to the X-axis direction) and a height direction (i.e., the Z-axis direction) under the control of the controller 93.

Accordingly, the first driver 24 is capable of moving the cleaning liquid supply nozzle 31 in the X-axis direction, the Y-axis direction, and the Z-axis direction under the control of the controller 93. Also, the second driver 25 is capable of moving the liquid supply nozzle 33 in the X-axis direction, the Y-axis direction, and the Z-axis direction under the control of the controller 93.

The controller 93 controls the rotational driver 23, the cleaning liquid discharger 30, the liquid discharger 32, the first driver 24, and the second driver 25 as described above to carry out the cleaning processing for the substrate W.

The processing device 10 shown in FIG. 2 is further equipped with a cup structure 29 and a monitoring device 35 provided inside the processing tub 21.

The cup structure 29 is disposed to horizontally surround the substrate W held by the substrate holder 22. The cup structure 29 typically includes one or more cup bodies having an annular shape in a plan view. Each cup body has a cylindrical shape with open top and bottom, and the substrate holder 22 and/or the substrate W held by the substrate holder 22 are disposed inside each cup body. The cup structure 29 receives the liquid (including the rinse liquid Lr and the cleaning liquid Lp) scattered from the substrate W, and suppresses the scattered liquid from leaking from the processing tub 21.

The monitoring device 35 monitors a state of a liquid film formed on a processing surface (i.e., a top surface) of the substrate W held by the substrate holder 22 under the control of the controller 93. The specific state of the liquid film monitored by the monitoring device 35 is not particularly limited. The monitoring device 35 may monitor, for example, the thickness of the liquid film on the processing surface of the substrate W. A monitoring result of the monitoring device 35 is sent to the controller 93.

The specific configuration of the monitoring device 35 is not specifically limited. Typically, the monitoring device 35 may include one or more measuring devices using a camera (imaging device) and a laser. Further, the monitoring device 35 may be composed of a combination of a measuring device and an operation processor (for example, the controller 93) provided separately. By way of example, measurement data may be sent from the measuring device of the monitoring device 35 to the controller 93 that functions as the operation processor, and the controller 93 may analyze the measurement data to acquire the state of the liquid film formed on the processing surface of the substrate W.

The processing device 10 may be equipped with other devices.

For example, the processing device 10 may be equipped with a bottom surface cleaning device (not shown) configured to clean the bottom surface of the substrate W held by the substrate holder 22. The bottom surface cleaning device includes, for example, a cleaning body implemented by a brush or a sponge configured to be pressed against the bottom surface of the substrate W; a cleaning liquid discharge nozzle configured to discharge a cleaning liquid; and a bottom surface cleaning moving device configured to move the cleaning body and the cleaning liquid discharge nozzle. Under the control of the controller 93, the bottom surface cleaning moving device moves the cleaning body and the cleaning liquid discharge nozzle. By pressing the cleaning body while applying the cleaning liquid to the bottom surface of the substrate W, the bottom surface of the substrate W can be cleaned.

Further, there may be provided one or more attraction pads (not shown) each capable of holding a portion of the bottom surface of the substrate W other than the center thereof. While the substrate W is being held by the attraction pad, a portion (center) of the bottom surface of the substrate W that is in contact with the substrate holder 22 can be cleaned. Meanwhile, while the substrate W is being held by the substrate holder 22, the portion of the bottom surface of the substrate W that is in contact with the attraction pad can be cleaned.

Additionally, a plurality of (e.g., three) elevating pins (not shown) may be provided around the substrate holder 22. These elevating pins are configured to be movable up and down by an elevating mechanism (not shown). With this configuration, the substrate W can be delivered between these elevating pins and a transfer mechanism (second transfer mechanism 85 (see FIG. 1)) provided outside the processing device 10. Furthermore, the substrate W can also be delivered between the elevating pins and the substrate holder 22 or the aforementioned attraction pad.

Moreover, there may be a processing liquid discharger (not shown) configured to discharge another processing liquid (for example, a chemical liquid) to the substrate W under the control of the controller 93.

Now, an example of a substrate liquid processing method performed in the processing device 10 shown in FIG. 2 will be described.

In the cleaning processing with the cleaning liquid Lp in the form of mist, the rinse liquid Lr is supplied to the center or the vicinity of the center to cover the entire processing surface (top surface) of the substrate W with the rinse liquid Lr (liquid).

Meanwhile, since the cleaning processing needs to be performed on the entire processing surface of the substrate W, the cleaning liquid Lp in the form of mist is applied to the entire processing surface of the substrate W. Specifically, by moving a discharge position of the cleaning liquid Lp on the processing surface in a radial direction of the processing surface while rotating the substrate W, the cleaning liquid Lp is directly discharged onto the entire processing surface.

For this reason, when the cleaning liquid Lp is supplied to the center or the vicinity of the center of the substrate W, the cleaning liquid Lp collides with the rinse liquid Lr supplied to the center or the vicinity of the center of the substrate W, causing a liquid splash to easily occur. Since such a liquid splash may cause a particle on the substrate W, it is desirable that the liquid splash is avoided as much as possible.

In order to suppress the aforementioned liquid splash caused by the collision between the cleaning liquid Lp and the rinse liquid Lr, the following measures may be effective.

For example, by reducing the amount of the rinse liquid Lr applied to the processing surface of the substrate W and thus thinning the film of the rinse liquid Lr on the processing surface, the liquid splash that might occur when the cleaning liquid Lp is applied on the substrate W can be suppressed. However, in this case, the amount of the rinse liquid Lr on the processing surface of the substrate W may become insufficient to suppress the particle that might be caused by the scattered liquid splashing back from the cup or the like. As a result, the defect may be more likely to occur on the processing surface of the substrate W.

In addition, by increasing the rotation speed of the substrate W to thereby thin the film of the rinse liquid Lr on the processing surface of the substrate W, the liquid splash may be suppressed when the cleaning liquid Lp is applied onto the substrate W. However, even in this case, the amount of the rinse liquid Lr on the processing surface of the substrate W may become insufficient, making it easy for the defect to occur on the processing surface of the substrate W. Also, in this case, the liquid in the form of mist may be swirled up by the substrate W being rotated at a high speed, so that the liquid may be easily scattered from the substrate W. As a result, the scattered liquid splashed back from the cup or the like may adhere to the processing surface of the substrate W, making it easy for the particles to adhere to the processing surface. Furthermore, in this case, the film thickness of the rinse liquid Lr tends to increase locally at a place other than the center or near the center of the processing surface of the substrate W. The cleaning liquid Lp and the rinse liquid Lr tend to collide with each other at this place, making it easy for the liquid splash to occur.

Here, as a discharge direction of the rinse liquid Lr with respect to the processing surface of the substrate W approaches a direction perpendicular to the processing surface, the liquid splash tends to be less likely to occur. That is, as the discharge direction of the rinse liquid Lr with respect to the processing surface of the substrate W becomes further deviated from the direction perpendicular to the processing surface (that is, with an increase of an inclination with respect to a vertical direction), the liquid splash may be more likely to occur.

In addition, when the cleaning liquid Lp is discharged toward the substrate W along with the gas as in the two-fluid cleaning, the occurrence of the liquid splash may be suppressed by reducing the flow rate of the gas. In this case, however, the performance of removing the particles from the processing surface of the substrate W may be deteriorated.

Hereinafter, an example of a substrate liquid processing method advantageous to apply the cleaning liquid (processing liquid) Lp to the substrate W while suppressing the adhesion of the particles to the substrate W will be discussed.

The substrate liquid processing method described below is performed as the controller 93 appropriately controls the individual components of the processing system 80 (processing device 10).

FIG. 3 to FIG. 8 are diagrams showing an example of the substrate liquid processing method according to a first exemplary embodiment.

Figures 3, 4:
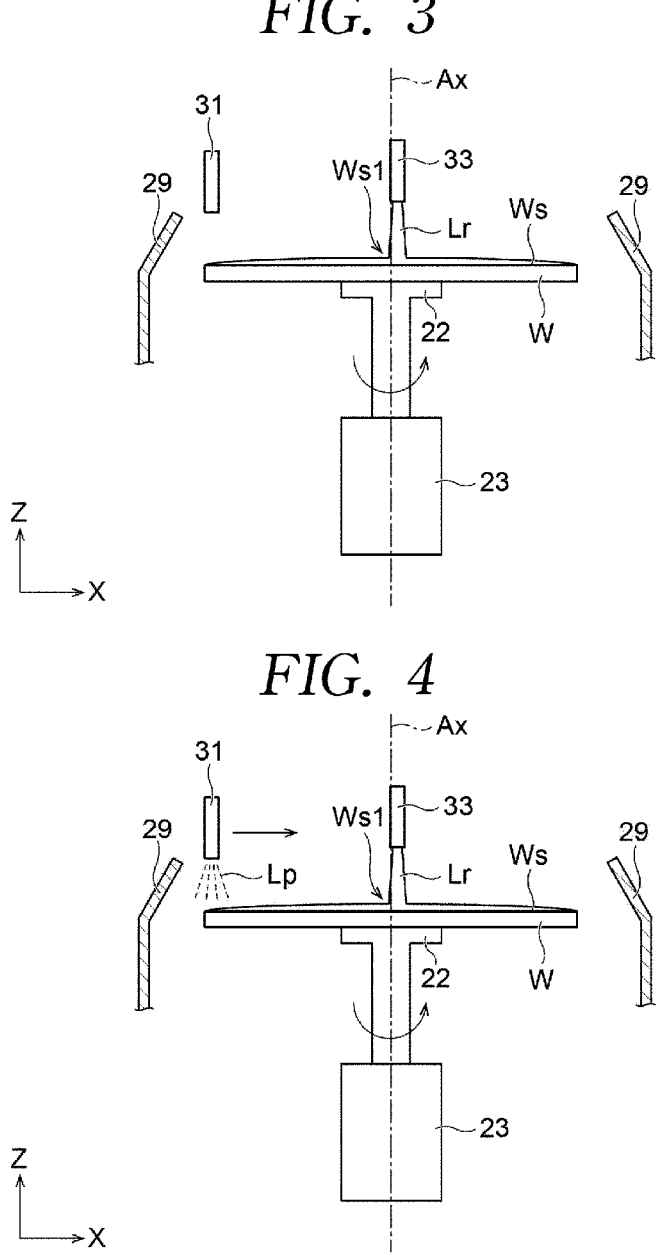
FIG. 3 is a diagram illustrating an example of a substrate liquid processing method according to the first exemplary embodiment.
FIG. 4 is a diagram illustrating an example of the substrate liquid processing method according to the first exemplary embodiment.

First, as shown in FIG. 3, the liquid supply nozzle 33 discharges the rinse liquid Lr toward a processing surface Ws of the substrate W held by the substrate holder 22 (pre-rinsing process).

In this pre-rinsing process, the liquid supply nozzle 33 discharges the rinse liquid Lr toward an area (i.e., a first liquid supply area Ws1) including the center (i.e., the position through which the rotation axis Ax passes) and the vicinity of the center of the processing surface Ws. As a result, the rinse liquid Lr diffuses over the entire processing surface Ws of the substrate W being rotated, so that the entire processing surface Ws is covered with the liquid film of the rinse liquid Lr.

Here, the main discharge direction of the rinse liquid Lr from the liquid supply nozzle 33 is the vertical direction (downwards in the Z-axis direction). However, the discharge direction of all the rinse liquid Lr discharged from the liquid supply nozzle 33 need not be strictly vertical. At least some of the rinse liquid Lr discharged from the liquid supply nozzle 33 may head toward a direction inclined with respect to the vertical direction.

The first liquid supply area Ws1 where the rinse liquid Lr from the liquid supply nozzle 33 lands does not necessarily need to include the center of the processing surface Ws. For example, when some of the rinse liquid Lr discharged from the liquid supply nozzle 33 spreads to a range including the center of the processing surface Ws after landing on the processing surface Ws, it is possible to cover the entire processing surface Ws with the rinse liquid Lr even if the first liquid supply area Ws1 does not include the center of the processing surface Ws.

Further, while the rinse liquid Lr and the cleaning liquid Lp are being respectively applied onto the processing surface Ws from the cleaning liquid supply nozzle 31 and the liquid supply nozzle 33 (see FIG. 3 to FIG. 8), the substrate W is continuously rotated around the rotation axis Ax along with the substrate holder 22 by the rotational driver 23.

Then, while discharging the rinse liquid Lr from the liquid supply nozzle 33 onto the processing surface Ws of the substrate W held and being rotated by the substrate holder 22, the cleaning liquid Lp is discharged from the cleaning liquid supply nozzle 31 toward the processing surface Ws (see FIG. 4). As a result, while maintaining the liquid film on the processing surface Ws of the substrate W, the processing surface Ws of the substrate W can be cleaned by the cleaning liquid Lp (atomized cleaning process). Further, the main discharge direction of the cleaning liquid Lp from the cleaning liquid supply nozzle 31 is the vertical direction. However, the discharge direction of all the cleaning liquid Lp discharged from the cleaning liquid supply nozzle 31 need not be strictly vertical. At least some of the cleaning liquid Lp discharged from the cleaning liquid supply nozzle 31 may head toward a direction inclined with respect to the vertical direction.

Specifically, as shown in FIG. 4, while discharging the rinse liquid Lr from the liquid supply nozzle 33 toward the first liquid supply area Ws1, the discharge of the cleaning liquid Lp from the cleaning liquid supply nozzle 31 toward an outer peripheral portion (particularly, the edge) of the processing surface Ws is started.

At this time, the rotational driver 23 rotates the substrate W at a rotation speed at which the thickness of the liquid film on the outer peripheral portion of the processing surface Ws becomes sufficiently small. As a result, the above-described atomized cleaning process is started from a location on the processing surface Ws where the liquid film is sufficiently thin, so that the occurrence of the liquid splash at the beginning of the atomized cleaning process can be suppressed.

The cleaning liquid supply nozzle 31 of the present exemplary embodiment starts the discharge of the gas after starting the discharge of the cleaning liquid Lp toward the outer peripheral portion of the processing surface Ws. That is, under the control of the controller 93, after the flow path of the supply line 36d (see FIG. 2) is switched from a closed state to an open state by the opening/closing valve 36c, the flow path of the supply line 37d is switched from a closed state to an open state by the opening/closing valve 37c.

Generally, when a gas is discharged prior to a liquid toward the processing surface Ws from a two-fluid nozzle, a liquid film on the processing surface Ws may disappears, and a particle such as a water mark tends to be easily generated on the processing surface Ws. Therefore, as in the present exemplary embodiment, by starting the discharge of the gas after starting the discharge of the cleaning liquid Lp, it is avoided that the gas is discharged from the cleaning liquid supply nozzle 31 before the cleaning liquid Lp, so that the generation of the particle such as the watermark on the processing surface Ws is suppressed.

In the present exemplary embodiment, the discharge of the gas from the cleaning liquid supply nozzle 31 is started in the state that the cleaning liquid Lp from the cleaning liquid supply nozzle 31 is discharged toward the outer peripheral portion of the processing surface Ws. As a result, the outer peripheral portion of the processing surface Ws is cleaned by the cleaning liquid Lp in the form of mist that is discharged from the cleaning liquid supply nozzle 31 together with the gas.

In the state that the rinse liquid Lr is continuously supplied from the liquid supply nozzle 33 onto the processing surface Ws, the cleaning liquid supply nozzle 31 is moved from an outer peripheral side of the substrate W toward a center side thereof while discharging the cleaning liquid Lp and the gas.

That is, the controller 93 controls the liquid discharger 32 and the second driver 25 to discharge the rinse liquid Lr from the liquid supply nozzle 33 toward the processing surface Ws (particularly, the first liquid supply area Ws1) of the substrate W being rotated. Further, the controller 93 controls the cleaning liquid discharger 30 and the first driver 24 to allow the landing position of the cleaning liquid Lp from the cleaning liquid supply nozzle 31 on the processing surface Ws on which the liquid film (including the rinse liquid Lr)

is formed to be moved from the outer peripheral portion of the processing surface Ws toward the central portion thereof. As a result, the rinse liquid Lr is discharged from the liquid supply nozzle 33 toward the processing surface Ws of the substrate W being rotated, and, at the same time, the cleaning liquid Lp in the form of mist is discharged from the cleaning liquid supply nozzle 31 toward the processing surface Ws (processing liquid scanning process).

The central portion referred to here may include not only the center of the processing surface Ws (the point through which the rotation axis Ax passes) but also a range in the vicinity of the center. Therefore, the landing position of the cleaning liquid Lp on the processing surface Ws may be moved toward the center of the processing surface Ws or may be moved toward the vicinity of the center of the processing surface Ws.

Additionally, when the cleaning liquid supply nozzle 31 is moved from the outer peripheral side of the substrate W toward the center side thereof, the cleaning liquid supply nozzle 31 does not necessarily have to be moved toward strictly the center (i.e., the rotation axis Ax) of the processing surface Ws. That is, the cleaning liquid supply nozzle 31 may move along a radial direction of the processing surface Ws having a circular shape in a plan view, or may move without following the radial direction. Here, however, it is desirable that the cleaning liquid supply nozzle 31 is moved from the outer peripheral side of the substrate W toward the center side through a path through which the cleaning liquid Lp is directly discharged onto the entire processing surface Ws of the substrate W being rotated.

The liquid supply nozzle 33 discharges, under the control of the controller 93, the rinse liquid Lr toward the central portion of the processing surface Ws while the landing position of the cleaning liquid Lp is being moved from the outer peripheral portion of the processing surface Ws toward a first intermediate portion located between the outer peripheral portion and the central portion of the processing surface Ws (see FIG. 4). That is, the controller 93 allows the rinse liquid Lr to be discharged from the liquid supply nozzle 33 toward the first liquid supply area Ws1 of the processing surface Ws while the landing position of the cleaning liquid Lp is being moved from the outer peripheral portion of the processing surface Ws toward the first intermediate portion by controlling the second driver 25.

Figures 5, 6:
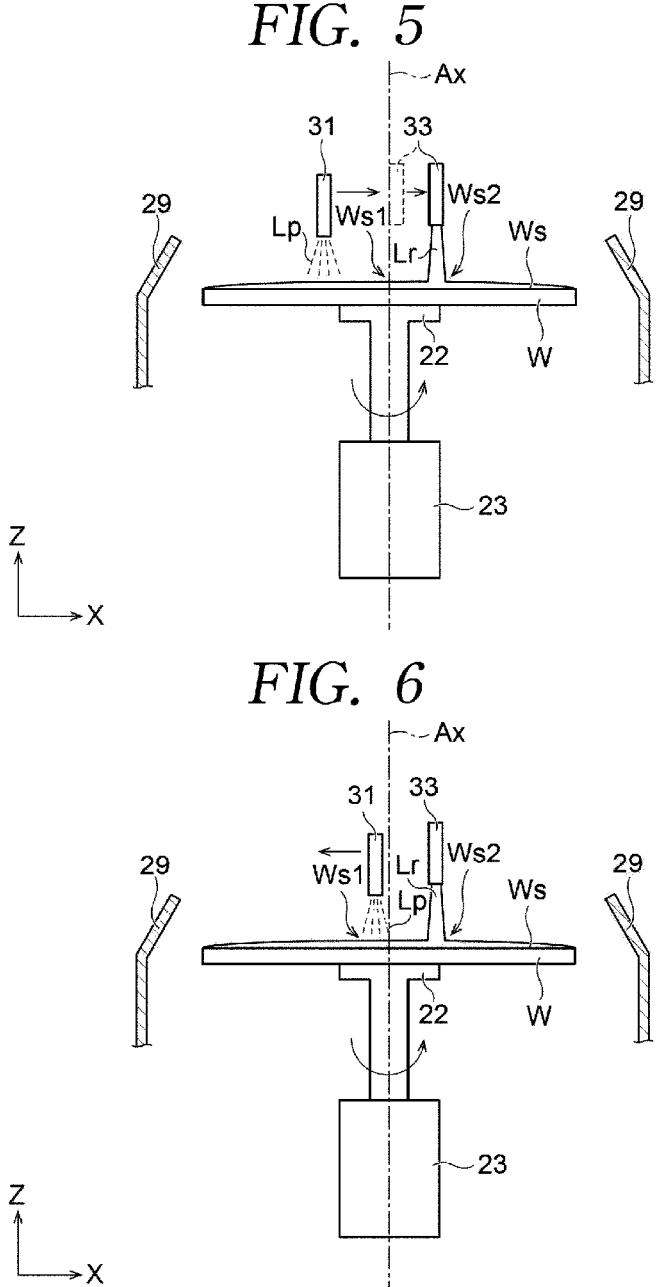
FIG. 5 is a diagram illustrating an example of the substrate liquid processing method according to the first exemplary embodiment.
FIG. 6 is a diagram illustrating an example of the substrate liquid processing method according to the first exemplary embodiment.

Meanwhile, the liquid supply nozzle 33 discharges, under the control of the controller 93, the rinse liquid Lr toward a region of the processing surface Ws other than the central portion thereof while the landing position of the cleaning liquid Lp on the processing surface Ws is being moved from the first intermediate portion of the processing surface Ws toward the central portion (see FIG. 5). That is, the controller 93 allows the rinse liquid Lr to be discharged from the liquid supply nozzle 33 toward a second liquid supply area Ws2 of the processing surface Ws while the landing position of the cleaning liquid Lp is being moved from the first intermediate portion of the processing surface Ws toward the central portion by controlling the second driver 25. Here, the distance from the center of the processing surface Ws (i.e., the rotation axis Ax) to the second liquid supply area Ws2 is larger than the distance from the center of the processing surface Ws to the first liquid supply area Ws1.

In the present exemplary embodiment as described above, the second driver 25 moves the liquid supply nozzle 33 in the horizontal direction, so that the landing position of the rinse liquid Lr from the liquid supply nozzle 33 on the processing surface Ws is changed. That is, as the second driver 25 moves the liquid supply nozzle 33, the rinse liquid Lr from the liquid supply nozzle 33 is switched between a state in which it is discharged toward the first liquid supply area Ws1 and the state in which it is discharged toward the second liquid supply area Ws2. Further, the landing areas Ws1 and Ws2 of the rinse liquid Lr are determined such that the entire processing surface Ws is continuously covered with the liquid films by the cleaning liquid Lp discharged from the cleaning liquid supply nozzle 31 and the rinse liquid Lr discharged from the liquid supply nozzle 33.

In the present exemplary embodiment, in the whole or a part of the time during which the landing position of the rinse liquid Lr from the liquid supply nozzle 33 is switched in this way, the moving speed of the cleaning liquid supply nozzle 31 toward the central portion of the processing surface Ws is reduced. As a result, it is possible to suppress the liquid splash that might occur in the state that the landing of the rinse liquid Lr on the processing surface Ws is unstable after the landing position of the rinse liquid Lr is switched. In addition, the cleaning liquid supply nozzle 31 whose moving speed is once reduced in this way is then moved toward the central portion of the processing surface Ws at its original moving speed (i.e., at a relatively high moving speed) again.

Moreover, in the present exemplary embodiment, the amount of the rinse liquid Lr discharged from the liquid supply nozzle 33 toward the second liquid supply area Ws2 per unit time is smaller than the amount of the rinse liquid Lr discharged from the liquid supply nozzle 33 toward the first liquid supply area Ws1 per unit time. Accordingly, the amount of the rinse liquid Lr near the landing position of the cleaning liquid Lp on the processing surface Ws is reduced, so that the splashing of the rinse liquid Lr and/or the cleaning liquid Lp can be suppressed.

In the present exemplary embodiment, the rotation speed of the substrate W when the landing position of the cleaning liquid Lp is being moved toward the central portion of the processing surface Ws from a second intermediate portion located between the outer peripheral portion and the central portion of the processing surface Ws is higher than the rotation speed of the substrate W when the landing position of the cleaning liquid Lp is being moved from the outer peripheral portion of the processing surface Ws toward the second intermediate portion thereof. The distance from the center (rotation axis Ax) of the processing surface Ws to the second intermediate portion may be equal to or different from the distance from the center of the processing surface Ws to the aforementioned first intermediate portion.

In general, the lower the rotation speed of the substrate W is, the liquid film on the processing surface Ws tends to be thicker at the center side of the processing surface Ws (for example, near the landing position of the rinse liquid Lr and/or the cleaning liquid Lp). Further, by reducing the rotation speed of the substrate W, the rinse liquid Lr on the processing surface Ws may be diffused on the processing surface Ws, bypassing the landing position of the cleaning liquid Lp on the processing surface Ws (see FIG. 9A to described later). For this reason, by keeping the rotation speed of the substrate W relatively small while the landing position of the cleaning liquid Lp is being moved from the second intermediate portion toward the central portion of the processing surface Ws as described above, the liquid splash can be suppressed.

As shown in FIG. 6, if the landing position of the cleaning liquid Lp from the cleaning liquid supply nozzle 31 on the processing surface Ws reaches the central portion of the processing surface Ws, the cleaning liquid supply nozzle 31 may be moved back from the central portion toward the outer peripheral portion of the processing surface Ws in the X-axis direction. Further, the cleaning liquid supply nozzle 31 may be returned without being moved to directly above the center of the processing surface Ws.

Figures 7, 8:
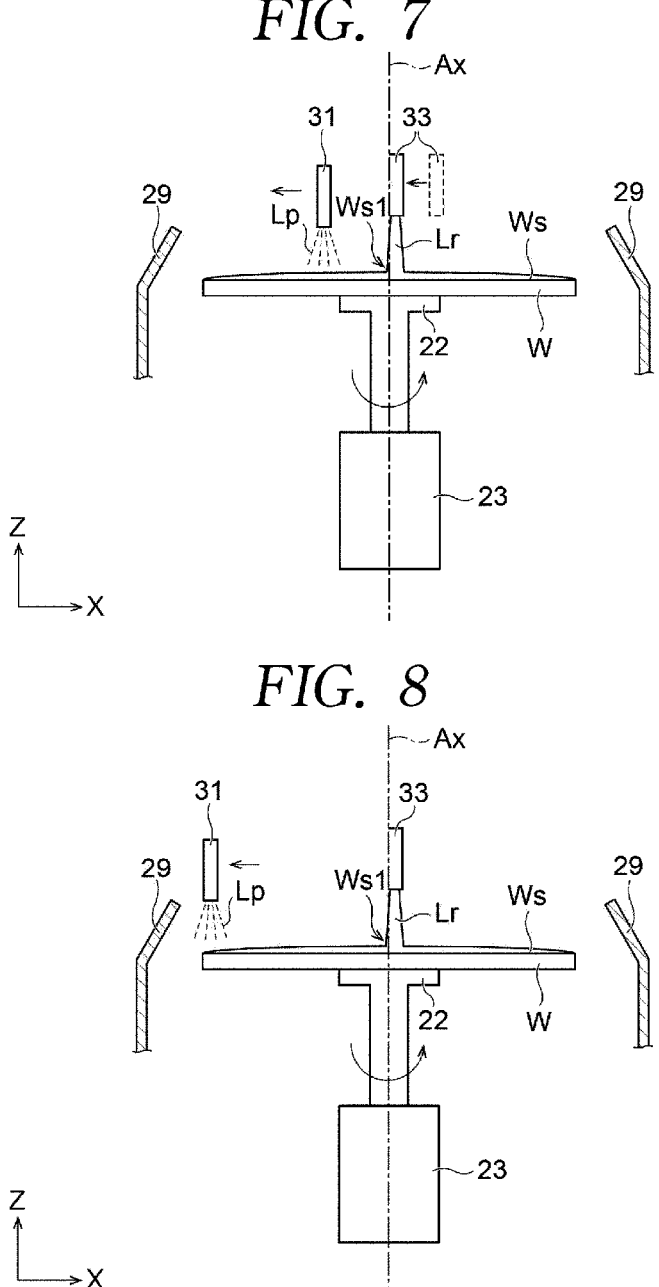
FIG. 7 is a diagram illustrating an example of the substrate liquid processing method according to the first exemplary embodiment.
FIG. 8 is a diagram illustrating an example of the substrate liquid processing method according to the first exemplary embodiment.

As illustrated in FIG. 7, if the landing position of the cleaning liquid Lp from the cleaning liquid supply nozzle 31 on the processing surface Ws reaches a third intermediate portion between the central portion and the outer peripheral portion of the processing surface Ws, the landing position of the rinse liquid Lr from the liquid supply nozzle 33 on the processing surface Ws is changed.

That is, if the landing position of the cleaning liquid Lp reaches the third intermediate portion, the liquid supply nozzle 33 is moved by the second driver 25, so that the landing position of the rinse liquid Lr is switched from the second liquid supply area Ws2 to the first liquid supply area Ws1. The distance from the center of the processing surface Ws to the third intermediate portion may be equal to or different from the distance from the center of the processing surface Ws to the first intermediate portion and/or the second intermediate portion described above.

In addition, in the whole or a part of the time during which the landing position of the rinse liquid Lr from the liquid supply nozzle 33 is switched from the second liquid supply area Ws2 to the first liquid supply area Ws1, the moving speed of the cleaning liquid supply nozzle 31 toward the outer peripheral portion of the processing surface Ws may be reduced. Accordingly, the splashing of the rinse liquid Lr and/or the cleaning liquid Lp can be suppressed. The cleaning liquid supply nozzle 31 whose moving speed is once reduced in this way is then moved toward the outer peripheral portion of the processing surface Ws at its original moving speed (that is, at a relatively high moving speed).

Moreover, the rotation speed of the substrate W when the landing position of the cleaning liquid Lp is being moved from the central portion of the processing surface Ws toward a fourth intermediate portion located between the outer peripheral portion and the central portion of the processing surface Ws may be set to be lower than the rotation speed of the substrate W when the landing position of the cleaning liquid Lp is being moved from the fourth intermediate portion toward the outer peripheral portion of the processing surface Ws. The distance from the center of the processing surface Ws to the fourth intermediate portion here may be equal to or different from the distance from the center of the processing surface Ws to the first intermediate portion, the second intermediate portion, and/or the third intermediate portion described above.

Thereafter, the cleaning liquid supply nozzle 31 is moved toward the outer peripheral side of the processing surface Ws until the landing position of the cleaning liquid Lp from the cleaning liquid supply nozzle 31 on the processing surface Ws reaches the outer peripheral portion (particularly, the edge) of the processing surface Ws (see FIG. 8). At this time, the liquid supply nozzle 33 continues to discharge the rinse liquid Lr toward the first liquid supply area Ws1.

Then, the discharge of the cleaning liquid Lp and the gas from the cleaning liquid supply nozzle 31 is stopped, while the discharge of the rinse liquid Lr from the liquid supply nozzle 33 toward the processing surface Ws (particularly, the first liquid supply area Ws1) is continued for a while (post-rinsing process). Thereafter, the discharge of the rinse liquid Lr from the liquid supply nozzle 33 is stopped.

Through the above-described series of processes (see FIG. 3 to FIG. 8), the cleaning of the processing surface Ws of the substrate W can be accomplished while suppressing the liquid splash. As a result, the generation of the particles on the processing surface Ws can be effectively suppressed.

Figure 9A:
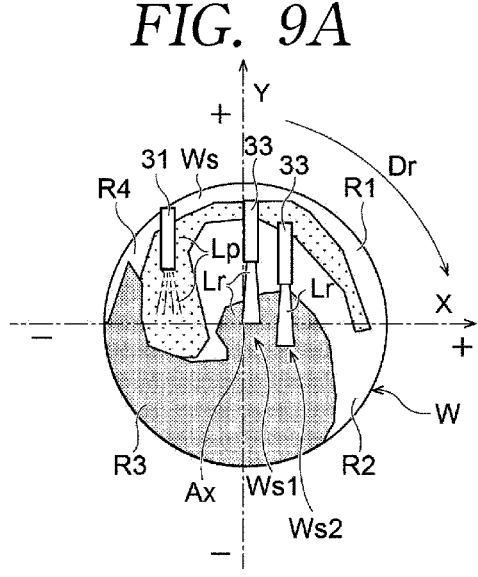
FIG. 9A is a diagram illustrating an example of diffusion states of a rinse liquid and a cleaning liquid on a processing surface of a substrate.
Figure 9B:
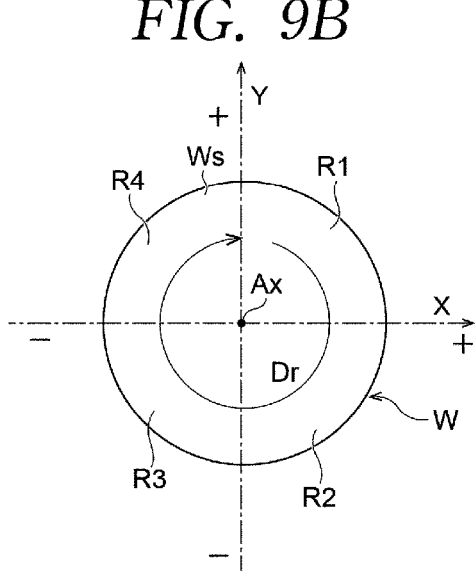
FIG. 9B is a diagram illustrating an example of division regions on the processing surface of the substrate.

FIG. 9A is a diagram showing an example of a diffusion state of the rinse liquid Lr and the cleaning liquid Lp on the processing surface Ws of the substrate W. FIG. 9B is a diagram showing an example of division regions R1 to R4 of the processing surface Ws of the substrate W.

As described above, by changing the landing position of the rinse liquid Lr from the liquid supply nozzle 33 on the processing surface Ws depending on the landing position of the cleaning liquid Lp from the cleaning liquid supply nozzle 31 on the processing surface Ws, the liquid splash is suppressed.

Through intensive research, the inventor of the present application has obtained new knowledge regarding the "landing position of the rinse liquid Lr on the processing surface Ws" which is advantageous for efficiently cleaning the processing surface Ws while suppressing the liquid splash.

That is, the processing surface Ws of the substrate W is divided into four regions R1 to R4 by the linear X- and Y-axes passing through the rotation center (rotation axis Ax) of the processing surface Ws and orthogonal to each other. Here, the landing position of the cleaning liquid Lp discharged from the cleaning liquid supply nozzle 31 on the processing surface Ws is moved from the outer peripheral portion of the processing surface Ws toward the central portion thereof in the direction in which the X-axis extends.

The landing position of the cleaning liquid Lp while it is being moved from the outer peripheral portion of the processing surface Ws toward the central portion thereof is set in one (see a third division region R3 and a fourth division region R4 shown in FIG. 9B) of two sections of the processing surface Ws divided by the Y-axis. In this case, if the second liquid supply area Ws2 is set in the other (see a first division region R1 and a second division region R2 shown in FIG. 9B) of the two sections of the processing surface Ws divided by the Y-axis, it is advantageous to efficiently clean the processing surface Ws while suppressing the liquid splash.

Further, as the substrate W is rotated in a rotation direction Dr by the rotational driver 23 (see FIG. 3, etc.), the regions of the processing surface Ws other than the center pass through the plus side of the X-axis, the minus side of the Y-axis, the minus side of the X-axis, and the plus side of the Y-axis sequentially and repeatedly as shown in FIG. 9B. In this case, it is desirable that the second liquid supply area Ws2 is set in one (see the division region R2 and the division region R3 shown in FIG. 9B) of two sections of the processing surface Ws divided by the X-axis, where the minus side of the Y-axis is located. In this case, it is advantageous to efficiently clean the processing surface Ws while suppressing the liquid splash.

Considering the above-described knowledge comprehensively, when the landing position of the cleaning liquid Lp from the cleaning liquid supply nozzle 31 exists in the third division region R3 and/or the fourth division region R4 shown in FIG. 9B, it is desirable that the landing position of the rinse liquid Lr from the liquid supply nozzle 33 exists in the second division region R2.

In the present exemplary embodiment as described above, by changing the landing position of the rinse liquid Lr on the processing surface Ws depending on the landing position of the cleaning liquid Lp on the processing surface Ws, the liquid splash is suppressed, so that the generation of the particles can be suppressed.

Further, by changing the moving speed of the landing position of the cleaning liquid Lp on the processing surface Ws according to the change in the landing position of the rinse liquid Lr on the processing surface Ws, the liquid splash is suppressed, so that the generation of the particles can be suppressed.

Moreover, by changing the rotation speed of the substrate W according to the landing position of the cleaning liquid Lp on the processing surface Ws, it is possible to suppress the liquid splash while forming the liquid film on the entire processing surface Ws. Therefore, the generation of the particles can be suppressed.

Figure 10:
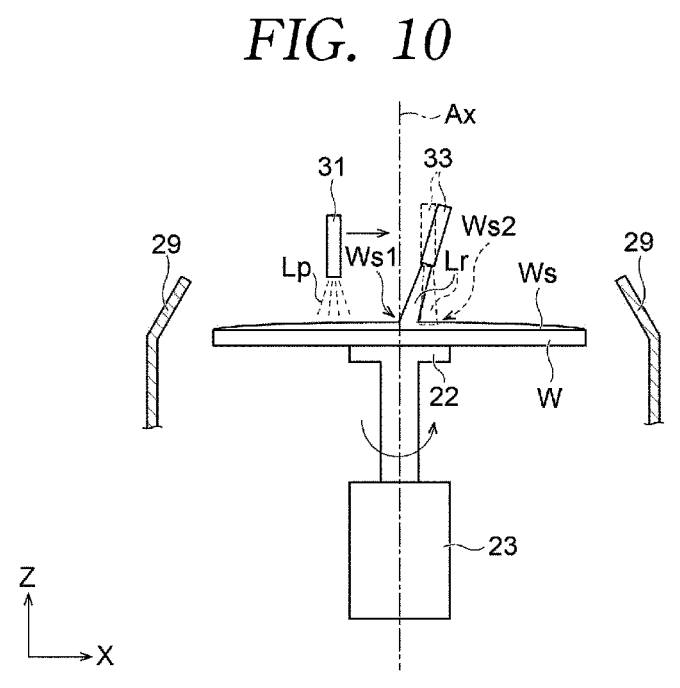

FIG. 10 is a diagram showing an example of driving the liquid supply nozzle 33 to change the landing position of the rinse liquid Lr on the processing surface Ws.

In the above-described exemplary embodiment, the position of the liquid supply nozzle 33 in the horizontal direction is changed by the second driver 25 in order to change the landing position of the rinse liquid Lr on the processing surface Ws. However, the present exemplary embodiment is not limited thereto.

For example, as shown in FIG. 10, the discharge direction of the rinse liquid Lr from the liquid supply nozzle 33 may be changed by adjusting the posture (particularly, a direction of a discharge opening) of the liquid supply nozzle 33 through the second driver 25 (see a "direction adjuster 25c" shown in FIG. 2). That is, the second driver 25 changes the discharge direction of the rinse liquid Lr from the liquid supply nozzle 33, whereby a state in which the rinse liquid Lr from the liquid supply nozzle 33 is discharged toward the first liquid supply area Ws1 and a state in which it is discharged toward the second liquid supply area Ws2 are switched.

FIG. 11 is a flowchart showing an example of changing the landing position of the rinse liquid Lr on the processing surface Ws by using a monitoring result of the monitoring device 35.

The controller 93 may change the landing position of the rinse liquid Lr on the processing surface Ws based on the monitoring result of the monitoring device 35 configured to monitor the state of the liquid film on the processing surface Ws.

By way of example, after the monitoring of the state of the liquid film on the processing surface Ws is started by the monitoring device 35 (S1 in FIG. 11), the discharge of the rinse liquid Lr from the liquid supply nozzle 33 toward the first liquid supply area Ws1 is started (S2). Further, the discharge of the cleaning liquid Lp from the cleaning liquid supply nozzle 31 toward the processing surface Ws is also started.

Then, the controller 93 determines whether the liquid film on the processing surface Ws is in a state where it may easily cause the liquid splash (i.e., in a "liquid splash inducing state") based on the monitoring result sent from the monitoring device 35 (S3). For example, if a place where the liquid film on the processing surface Ws is thick is close to the landing position of the cleaning liquid Lp on the processing surface Ws, there may be made a determination that the liquid film on the processing surface Ws is in the liquid splash inducing state.

When it is determined that the liquid film on the processing surface Ws is not in the liquid splash inducing state (N in S3), the monitoring by the monitoring device 35 is carried on, and the discharge of the rinse liquid Lr from the liquid supply nozzle 33 toward the first liquid supply area Ws1 is continued.

Meanwhile, when it is determined that the liquid film on the processing surface Ws is in the liquid splash inducing state (Y in S3), the controller 93 controls the second driver 25 to change the landing position of the rinse liquid Lr from the liquid supply nozzle 33 toward the second liquid supply area Ws2 from the first liquid supply area Ws1 (S4).

Thereafter, the controller 93 determines, based on the monitoring result of the monitoring device 35, whether the liquid film on the processing surface Ws has escaped from the liquid splash inducing state (S5).

When it is determined that the liquid film on the processing surface Ws has not come out of the liquid splash inducing state (N in S5), the monitoring by the monitoring device 35 is continued, and the discharge of the rinse liquid Lr from the liquid supply nozzle 33 toward the second liquid supply area Ws2 is carried on.

Meanwhile, when it is determined that the liquid film on the processing surface Ws has come out of the liquid splash inducing state (Y in S5), the controller 93 controls the second driver 25 to change the landing position of the rinse liquid Lr from the liquid supply nozzle 33 toward the first liquid supply area Ws1 from the second liquid supply area Ws2 (S6).

Then, when the cleaning processing for the substrate W as a processing target is not completed (N in S7), the above-described processes (S3 to S6) are repeated under the control of the controller 93.

Meanwhile, when the cleaning processing for the substrate W as the processing target is completed (Y in S7), the controller 93 controls the cleaning liquid discharger 30 and the liquid discharger 32 to stop the discharge of the cleaning liquid Lp from the cleaning liquid supply nozzle 31 and the discharge of the rinse liquid Lr from the liquid supply nozzle 33 (S8).

As described above, by controlling the second driver 25 to move the liquid supply nozzle 33 based on the monitoring result of the monitoring device 35, the controller 93 is capable of changing the landing position of the rinse liquid Lr on the processing surface Ws. Therefore, depending on the monitoring result of the monitoring device 35, the state in which the rinse liquid Lr is discharged from the liquid supply nozzle 33 toward the first liquid supply area Ws1 and the state in which the rinse liquid Lr is discharged from the liquid supply nozzle 33 toward the second liquid supply area Ws2 can be switched.

In addition, although the above-described monitoring device 35 monitors the state of the liquid film on the processing surface Ws, the monitoring device 35 may monitor other states. For example, the monitoring device 35 may monitors the positions of the cleaning liquid supply nozzle 31 and the liquid supply nozzle 33, the state of the cleaning liquid Lp discharged from the cleaning liquid supply nozzle 31, and/or the state of the rinse liquid Lr discharged from the liquid supply nozzle 33.

The controller 93 may conduct various controls based on the positions of the cleaning liquid supply nozzle 31 and the liquid supply nozzle 33 and the states of the cleaning liquid Lp and the rinse liquid Lr that are monitored by the monitoring device 35.

By way of example, the controller 93 may control the rotational driver 23 to adjust the rotation speed of the substrate W based on a relative position between the liquid supply nozzle 33 and a portion on the processing surface Ws where the liquid film is thick, which is monitored by the monitoring device 35. As the rotation speed of the substrate W is adjusted in this way, the overall thickness of the liquid film on the processing surface Ws and the relative position between the liquid supply nozzle 33 and the portion where the liquid film is thick can be optimized, so that the liquid splash can be suppressed, and the generation of the particles can be suppressed.

Second Exemplary Embodiment

In the second exemplary embodiment, parts identical or corresponding to those of the first exemplary embodiment described above will be assigned same reference numerals, and detailed description thereof will be omitted.

Figure 12:
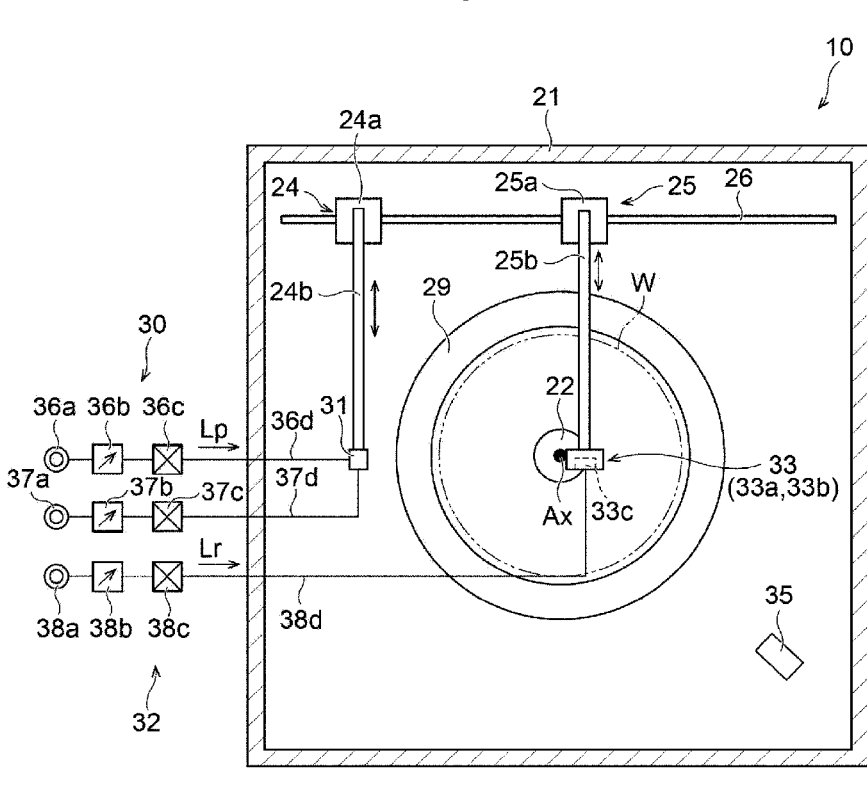
FIG. 12 is a diagram schematically illustrating an example of a processing device according to a second exemplary embodiment.

FIG. 12 is a diagram schematically illustrating an example of the processing device 10 according to the second exemplary embodiment. FIG. 12 shows various components inside the processing tub 21 seen from above.

In the above-described first exemplary embodiment, the controller 93 controls the second driver 25 to perform the switchover between the state in which the rinse liquid Lr from the liquid supply nozzle 33 is discharged toward the first liquid supply area Ws1 and the state in which it is discharged toward the second liquid supply area Ws2. Meanwhile, in the present exemplary embodiment, the controller 93 changes the nozzle that discharges the rinse liquid Lr to perform the switchover between the state in which the rinse liquid Lr from the liquid supply nozzle 33 is discharged toward the first liquid supply area Ws1 and the state in which it is discharged toward the second liquid supply area Ws2.

The liquid supply nozzle 33 of the present exemplary embodiment includes a first liquid supply nozzle 33a, a second liquid supply nozzle 33b, and a flow path adjuster 33c.

The first liquid supply nozzle 33a discharges the rinse liquid Lr toward the first liquid supply area Ws1 of the processing surface Ws of the substrate W. The second liquid supply nozzle 33b discharges the rinse liquid Lr toward the second liquid supply area Ws2 of the processing surface Ws.

Under the control of the controller 93, the flow path adjuster 33c adjusts a flow path connecting the first liquid supply nozzle 33a, the second liquid supply nozzle 33b, and a supply line 38d. That is, by adjusting the flow path, the flow path adjuster 33c supplies the rinse liquid Lr sent through the supply line 38d only to the first liquid supply nozzle 33a or the second liquid supply nozzle 33b. Further, by adjusting the flow path, the flow path adjuster 33c may supply the rinse liquid Lr sent through the supply line 38d to both the first liquid supply nozzle 33a and the second liquid supply nozzle 33b.

In the example shown in FIG. 12, the first liquid supply nozzle 33a and the second liquid supply nozzle 33b are provided as a single body, but the first liquid supply nozzle 33a and the second liquid supply nozzle 33b may be provided as separate bodies.

Further, in the example shown in FIG. 12, the first liquid supply nozzle 33a and the second liquid supply nozzle 33b are configured to be movable by the second driver 25, the same as the liquid supply nozzle 33 of the first exemplary embodiment described above. However, the first liquid supply nozzle 33a and the second liquid supply nozzle 33b may be fixed to the processing tube 21. Alternatively, the first liquid supply nozzle 33a and the second liquid supply nozzle 33b may be fixed in the X-axis direction, but may be configured to be movable in the Y-axis direction and/or the Z-axis direction.

In the example shown in FIG. 12, the rinse liquid Lr is supplied to the first liquid supply nozzle 33a and the second liquid supply nozzle 33b by a liquid source 38a, a flow rate controller 38b, an opening/closing valve 38c, and the supply line 38*d* that are shared by the first and second liquid supply nozzles 33*a* and 33*b*. However, each of the first liquid supply nozzle 33*a* and the second liquid supply nozzle 33*b* may be equipped with the liquid source 38*a*, the flow rate controller 38*b*, the opening/closing valve 38*c*, and/or the supply line 38*d* individually.

The other configuration of the processing device 10 shown in FIG. 12 is the same as that of the processing device 10 according to the first exemplary embodiment described above.

The controller 93 (see FIG. 1) of the present exemplary embodiment allows the rinse liquid Lr to be discharged from the first liquid supply nozzle 33*a* while the landing position of the cleaning liquid Lp from the cleaning liquid supply nozzle 31 is being moved from the outer peripheral portion of the processing surface Ws of the substrate W toward the first intermediate portion. Further, the controller 93 allows the rinse liquid Lr to be discharged from the second liquid supply nozzle 33*b* while the landing position of the cleaning liquid Lp is being moved from the first intermediate portion of the processing surface Ws toward the central portion thereof.

FIG. 13 to FIG. 18 are diagrams showing an example of a substrate liquid processing method according to the second exemplary embodiment. The substrate liquid processing method described below is performed as the controller 93 appropriately controls the individual components of the processing system 80 (processing device 10).

Figures 13, 14:
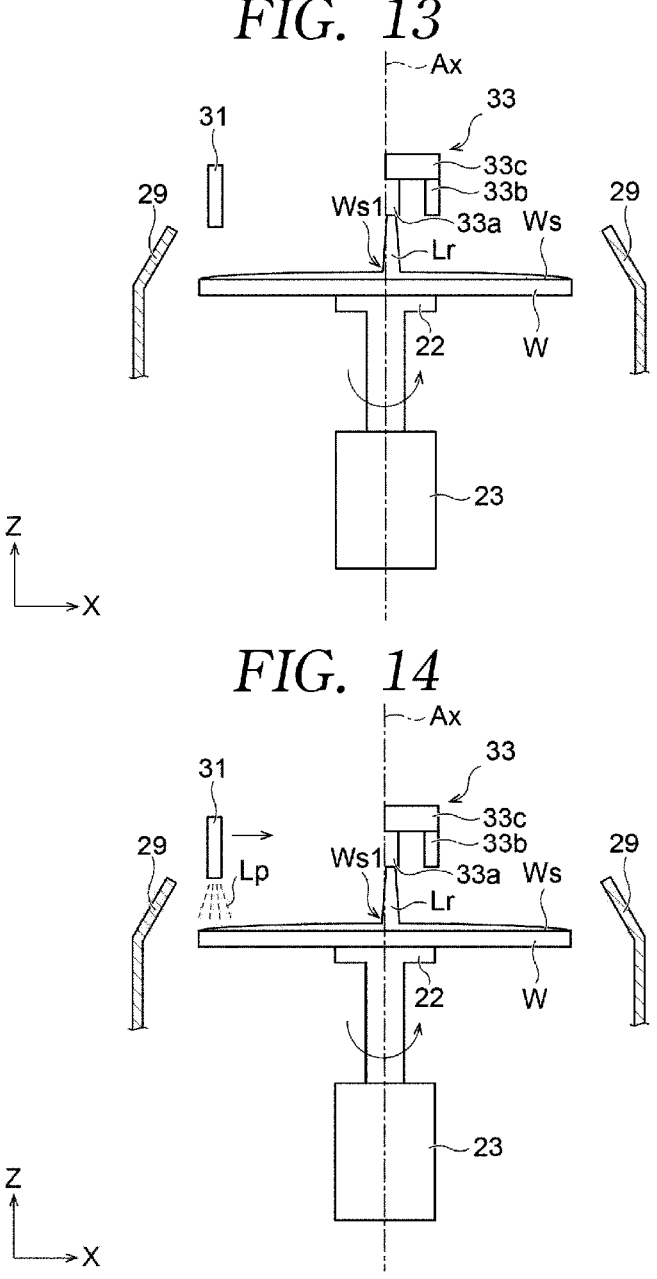
FIG. 13 is a diagram illustrating an example of a substrate liquid processing method according to the second exemplary embodiment.
FIG. 14 is a diagram illustrating an example of the substrate liquid processing method according to the second exemplary embodiment.

First, as shown in FIG. 13, the first liquid supply nozzle 33*a* discharges the rinse liquid Lr toward the processing surface Ws (particularly, the first liquid supply area Ws1) of the substrate W held by the substrate holder 22 (pre-rinsing process). As a result, the rinse liquid Lr diffuses over the entire processing surface Ws of the substrate W being rotated, so that the entire processing surface Ws is covered with the liquid film of the rinse liquid Lr.

Then, as shown in FIG. 14, while the first liquid supply nozzle 33*a* is supplying the rinse liquid Lr onto the processing surface Ws of the substrate W held and being rotated by the substrate holder 22, the cleaning liquid supply nozzle 31 discharges the cleaning liquid Lp toward the processing surface Ws. Specifically, as shown in FIG. 14, while the rinse liquid Lr is being discharged from the liquid supply nozzle 33 toward the first liquid supply area Ws1, the discharge of the cleaning liquid Lp from the cleaning liquid supply nozzle 31 toward the outer peripheral portion (particularly, the edge) of the processing surface Ws is started.

Then, the cleaning liquid supply nozzle 31 is moved in the horizontal direction (X-axis direction) from the outer peripheral side of the substrate W toward the center side thereof while discharging the cleaning liquid Lp and the gas. That is, the controller 93 controls the liquid discharger 32 to discharge the rinse liquid Lr from the first liquid supply nozzle 33*a* toward the processing surface Ws of the substrate W being rotated. Also, the controller 93 controls the cleaning liquid discharger 30 and the first driver 24 to allow the landing position of the cleaning liquid Lp from the cleaning liquid supply nozzle 31 on the processing surface Ws on which the liquid film is formed to be moved from the outer peripheral portion of the processing surface Ws toward the central portion thereof. As a result, the rinse liquid Lr is discharged from the first liquid supply nozzle 33*a* toward the processing surface Ws of the rotating substrate W, and, at the same time, the cleaning liquid Lp in the form of mist is discharged from the cleaning liquid supply nozzle 31 toward the processing surface Ws (processing liquid scanning process).

Under the control of the controller 93, the liquid supply nozzle 33 discharges the rinse liquid Lr toward the central portion of the processing surface Ws while the landing position of the cleaning liquid Lp is being moved from the outer peripheral portion of the processing surface Ws toward the first intermediate portion (see FIG. 15) (see FIG. 14). That is, by controlling the flow path adjuster 33*c*, the controller 93 allows the rinse liquid Lr to be discharged from the first liquid supply nozzle 33*a* toward the first liquid supply area Ws1 while the landing position of the cleaning liquid Lp is being moved from the outer peripheral portion of the processing surface Ws toward the first intermediate portion.

Figures 15, 16:
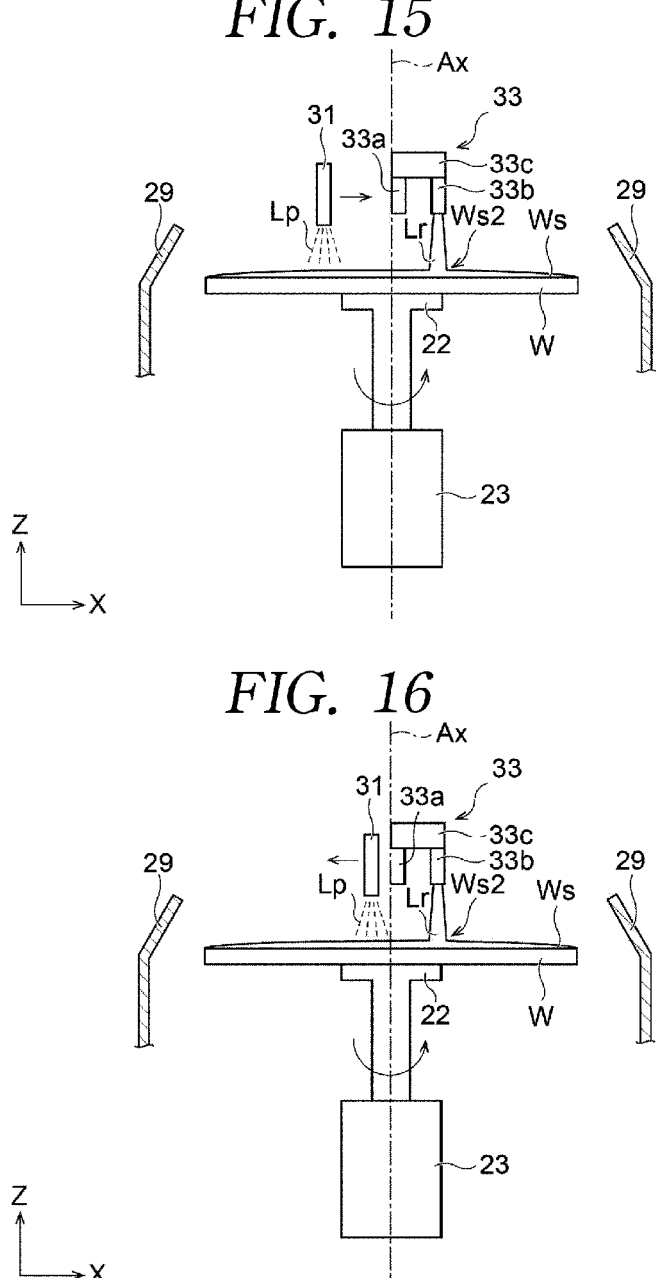
FIG. 15 is a diagram illustrating an example of the substrate liquid processing method according to the second exemplary embodiment.
FIG. 16 is a diagram illustrating an example of the substrate liquid processing method according to the second exemplary embodiment.

Meanwhile, under the control of the controller 93, the liquid supply nozzle 33 discharges the rinse liquid Lr toward a region of the processing surface Ws other than the central portion while the landing position of the cleaning liquid Lp on the processing surface Ws is being moved from the first intermediate portion of the processing surface Ws toward the central portion thereof (see FIG. 15). That is, by controlling the flow path adjuster 33*c*, the controller 93 allows the rinse liquid Lr to be discharged from the second liquid supply nozzle 33*b* toward the second liquid supply area Ws2 while the landing position of the cleaning liquid Lp is being moved from the first intermediate portion of the processing surface Ws toward the central portion thereof.

As described above, in the present exemplary embodiment, by switching the first liquid supply nozzle 33*a* and the second liquid supply nozzle 33*b* when the rinse liquid Lr is discharged, the landing position of the rinse liquid Lr on the processing surface Ws is changed. That is, as the flow path adjuster 33*c* adjusts the flow path, the state in which the rinse liquid Lr is discharged toward the first liquid supply area Ws1 is turned into the state in which the rinse liquid Lr is discharged toward the second liquid supply area Ws2.

In the present exemplary embodiment, the moving speed of the cleaning liquid supply nozzle 31 toward the central portion of the processing surface Ws is reduced in the whole or a part of the time during which the landing position of the rinse liquid Lr is switched in this way. Then, the cleaning liquid supply nozzle 31 whose moving speed is once reduced in this way is moved to the central portion of the processing surface Ws at its original moving speed (i.e., a relatively high moving speed) again.

Additionally, in the present exemplary embodiment, the flow rate of the rinse liquid Lr discharged from the first liquid supply nozzle 33*a* is larger than the flow rate of the rinse liquid Lr discharged from the second liquid supply nozzle 33*b*. Therefore, the amount of the rinse liquid Lr discharged from the second liquid supply nozzle 33*b* toward the second liquid supply area Ws2 per unit time is less than the amount of the rinse liquid Lr discharged from the first liquid supply nozzle 33*a* toward the first liquid supply area Ws1 per unit time.

In the present exemplary embodiment, the rotation speed of the substrate W when the landing position of the cleaning liquid Lp is being moved toward the central portion of the processing surface Ws from the second intermediate portion located between the outer peripheral portion and the central portion of the processing surface Ws is higher than the rotation speed of the substrate W when the landing position of the cleaning liquid Lp is being moved from the outer peripheral portion toward the second intermediate portion.

As shown in FIG. 16, when the landing position of the cleaning liquid Lp from the cleaning liquid supply nozzle 31 on the processing surface Ws reaches the central portion of the processing surface Ws, the cleaning liquid supply nozzle

31 is moved back toward the outer peripheral portion of the processing surface Ws from the central portion in the X-axis direction.

Further, as depicted in FIG. 17, if the landing position of the cleaning liquid Lp from the cleaning liquid supply nozzle 31 on the processing surface Ws reaches the third intermediate portion between the central portion and the outer peripheral portion of the processing surface Ws, the landing position of the rinse liquid Lr from the liquid supply nozzle 33 on the processing surface Ws is changed. That is, when the landing position of the cleaning liquid Lp reaches the third intermediate portion, the nozzle that discharges the rinse liquid Lr is switched from the second liquid supply nozzle 33b to the first liquid supply nozzle 33a by the flow path adjuster 33c. As a result, the landing position of the rinse liquid Lr on the processing surface Ws is switched from the second liquid supply area Ws2 to the first liquid supply area Ws1.

In addition, the moving speed of the cleaning liquid supply nozzle toward the outer peripheral portion of the processing surface Ws may be reduced in the whole or a part of the time during which the landing position of the rinse liquid Lr is switched from the second liquid supply area Ws2 to the first liquid supply area Ws1. The cleaning liquid supply nozzle 31 whose moving speed is once reduced in this way is moved back to the outer peripheral portion of the processing surface Ws at its original moving speed (i.e., a relatively high moving speed) again.

Furthermore, the rotation speed of the substrate W when the landing position of the cleaning liquid Lp is being moved from the fourth intermediate portion located between the outer peripheral portion and the central portion of the processing surface Ws toward the outer peripheral portion may be lower than the rotation speed of the substrate W when the landing position of the cleaning liquid Lp is being moved from the central portion toward the fourth intermediate portion of the processing surface Ws.

Afterwards, the cleaning liquid supply nozzle 31 is moved toward the outer peripheral side of the processing surface Ws until the landing position of the cleaning liquid Lp from the cleaning liquid supply nozzle 31 on the processing surface Ws reaches the outer peripheral portion (particularly, the edge) of the processing surface Ws (see FIG. 18).

Thereafter, the discharge of the cleaning liquid Lp and the gas from the cleaning liquid supply nozzle 31 is stopped, whereas the discharge of the rinse liquid Lr from the first liquid supply nozzle 33a toward the processing surface Ws (i.e., the first liquid supply area Ws1) is carried on for a while (post-rinsing process). Then, the discharge of the rinse liquid Lr from the liquid supply nozzle 33 is stopped.

Through the series of processes (see FIG. 13 to FIG. 18) described above, it is possible to clean the processing surface Ws of the substrate W while suppressing the liquid splash. As a result, the generation of the particles on the processing surface Ws can be effectively suppressed.

MODIFICATION EXAMPLES

In the above-described exemplary embodiments, the cleaning liquid supply nozzle 31 and/or the liquid supply nozzle 33 are moved linearly in the horizontal direction. However, the cleaning liquid supply nozzle 31 and/or the liquid supply nozzle 33 may be moved in a non-linearly manner. For example, under the control of the controller 93, the cleaning liquid supply nozzle 31 and/or the liquid supply nozzle 33 may be provided to a driving arm configured to be pivoted on a horizontal plane around a driving axis extending in a height direction. In this case, the cleaning liquid supply nozzle 31 and/or the liquid supply nozzle 33 is moved along an arc centered on the driving axis as the driving arm is pivoted.

Further, in the above-described exemplary embodiments, the cleaning liquid supply nozzle 31 is configured as the two-fluid nozzle. However, it may be configured as a one-fluid nozzle configured to discharge the cleaning liquid (processing liquid) Lp without discharging the gas.

Moreover, although the cleaning liquid Lp is used as the processing liquid in the above-described exemplary embodiments, the above-described technology (apparatus and method) may also be appropriately applicable to a case where a processing liquid other than the cleaning liquid is used. Likewise, it is also possible to appropriately apply the above-described technology (apparatus and method) to a case where another liquid is used instead of the rinse liquid Lr (e.g., DIW).

It should be noted that the exemplary embodiments and the modification examples disclosed in the present specification are nothing more than examples in all respects and are not intended to be anyway limiting. The above-described exemplary embodiments and modification examples may be omitted, replaced, and modified in various forms without departing from the scope and spirit of the following claims. For example, the above-described exemplary embodiments and modification examples may be combined in overall or partially, and exemplary embodiments other than those described above may be combined with the above-described exemplary embodiments or modification examples. In addition, the effects of the present disclosure described in the present specification are merely examples, and other effects may be achieved.

The technical category that embodies the above-described technical concept is not particularly limited. For example, the above-described substrate liquid processing apparatus may be applicable to another apparatus. Further, the above-described technical concept may be implemented by a computer program for causing a computer to execute one or more processes (steps) included in the above-described substrate liquid processing method (including a cleaning method of the substrate W). Additionally, the above-described technical concept may be implemented by a computer-readable non-transitory recording medium on which such a computer program is recorded.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:
1. A substrate liquid processing apparatus, comprising:
   a substrate holder configured to hold a substrate;
   a rotational driver configured to rotate the substrate held by the substrate holder;
   a liquid discharger having a liquid supply nozzle configured to discharge a liquid toward a processing surface of the substrate;

a processing liquid discharger having a processing liquid supply nozzle configured to discharge a processing liquid in a form of mist toward the processing surface;

a first driver configured to move the processing liquid supply nozzle; and a controller configured to control the processing liquid discharger, the first driver, and the liquid discharger, wherein the controller controls the processing liquid discharger and the first driver to allow a landing position of the processing liquid from the processing liquid supply nozzle on the processing surface on which a liquid film containing the liquid is formed to be moved from an outer peripheral portion of the processing surface toward a central portion thereof while controlling the liquid discharger to discharge the liquid from the liquid supply nozzle toward the processing surface of the substrate being rotated, wherein, under the control of the controller, the liquid supply nozzle is configured to discharge the liquid toward a first liquid supply area of the processing surface while the landing position of the processing liquid is being moved from the outer peripheral portion of the processing surface toward a first intermediate portion located between the outer peripheral portion and the central portion of the processing surface, the liquid supply nozzle is configured to discharge the liquid toward a second liquid supply area of the processing surface while the landing position of the processing liquid is being moved from the first intermediate portion toward the central portion, and a distance from a center of the processing surface to the second liquid supply area is larger than a distance from the center of the processing surface to the first liquid supply area.

2. The substrate liquid processing apparatus of claim 1, wherein the processing liquid supply nozzle is configured to discharge a gas together with the processing liquid.

3. The substrate liquid processing apparatus of claim 2, wherein the processing liquid supply nozzle is configured to start a discharge of the gas after starting a discharge of the processing liquid toward the outer peripheral portion of the processing surface.

4. The substrate liquid processing apparatus of claim 1, further comprising:

a second driver configured to move the liquid supply nozzle, wherein the controller controls the second driver to perform a switchover between a state in which the liquid is discharged from the liquid supply nozzle toward the first liquid supply area and a state in which the liquid is discharged from the liquid supply nozzle toward the second liquid supply area.

5. The substrate liquid processing apparatus of claim 4, wherein the second driver moves the liquid supply nozzle to perform the switchover between the state in which the liquid is discharged from the liquid supply nozzle toward the first liquid supply area and the state in which the liquid is discharged from the liquid supply nozzle toward the second liquid supply area.

6. The substrate liquid processing apparatus of claim 4, wherein the second driver changes a discharge direction of the liquid from the liquid supply nozzle to perform the switchover between the state in which the liquid is discharged from the liquid supply nozzle toward the first liquid supply area and the state in which the liquid is discharged from the liquid supply nozzle toward the second liquid supply area.

7. The substrate liquid processing apparatus of claim 1, wherein the liquid supply nozzle comprises:

a first liquid supply nozzle configured to discharge the liquid toward the first liquid supply area of the processing surface; and a second liquid supply nozzle configured to discharge the liquid toward the second liquid supply area of the processing surface, and wherein the controller allows the liquid to be discharged from the first liquid supply nozzle while the landing position of the processing liquid is being moved from the outer peripheral portion toward the first intermediate portion of the processing surface, and allows the liquid to be discharged from the second liquid supply nozzle while the landing position of the processing liquid is being moved from the first intermediate portion toward the central portion of the processing surface.

8. The substrate liquid processing apparatus of claim 7, wherein a flow rate of the liquid discharged from the first liquid supply nozzle is larger than a flow rate of the liquid discharged from the second liquid supply nozzle.

9. The substrate liquid processing apparatus of claim 1, wherein the processing surface is divided into four regions by linear X-axis and Y-axis passing through a rotation center of the processing surface and being orthogonal to each other, the landing position of the processing liquid discharged from the processing liquid supply nozzle on the processing surface is moved from the outer peripheral portion toward the central portion of the processing surface in a direction in which the X-axis extends, and the landing position of the processing liquid is set in a first one of two sections of the processing surface divided by the Y-axis while the landing position of the processing liquid is being moved from the outer peripheral portion toward the central portion of the processing surface, and the second liquid supply area is set in a second one of the two sections.

10. The substrate liquid processing apparatus of claim 9, wherein the regions of the processing surface other than the center thereof pass through a plus side of the X-axis, a minus side of the Y-axis, a minus side of the X-axis, and a plus side of the Y-axis sequentially and repeatedly as the substrate is rotated by the rotational driver, and the second liquid supply area is set in, of two sections of the processing surface divided by the X-axis, one in which the minus side of the Y-axis is located.

11. The substrate liquid processing apparatus of claim 1, further comprising:

a camera configured to monitor a state of the liquid film formed on the processing surface, wherein, based on a monitoring result of the camera, the controller performs a switchover between a state in which the liquid is discharged from the liquid supply nozzle toward the first liquid supply area and a state in which the liquid is discharged from the liquid supply nozzle toward the second liquid supply area.

12. The substrate liquid processing apparatus of claim 1, wherein a rotation speed of the substrate while the landing position of the processing liquid is being moved from a second intermediate portion located between the outer peripheral portion and the central portion of the processing surface toward the central portion is higher than a rotation speed of the substrate while the landing position of the processing surface is being moved from the outer peripheral portion toward the second intermediate portion of the processing surface.

13. The substrate liquid processing apparatus of claim 4, wherein the processing surface is divided into four regions by linear X-axis and Y-axis passing through a rotation center of the processing surface and being orthogonal to each other, the landing position of the processing liquid discharged from the processing liquid supply nozzle on the processing surface is moved from the outer peripheral portion toward the central portion of the processing surface in a direction in which the X-axis extends, and the landing position of the processing liquid is set in a first one of two sections of the processing surface divided by the Y-axis while the landing position of the processing liquid is being moved from the outer peripheral portion toward the central portion of the processing surface, and the second liquid supply area is set in a second one of the two sections.

14. The substrate liquid processing apparatus of claim 5, wherein the processing surface is divided into four regions by linear X-axis and Y-axis passing through a rotation center of the processing surface and being orthogonal to each other, the landing position of the processing liquid discharged from the processing liquid supply nozzle on the processing surface is moved from the outer peripheral portion toward the central portion of the processing surface in a direction in which the X-axis extends, and the landing position of the processing liquid is set in a first one of two sections of the processing surface divided by the Y-axis while the landing position of the processing liquid is being moved from the outer peripheral portion toward the central portion of the processing surface, and the second liquid supply area is set in a second one of the two sections.

15. The substrate liquid processing apparatus of claim 7, wherein the processing surface is divided into four regions by linear X-axis and Y-axis passing through a rotation center of the processing surface and being orthogonal to each other, the landing position of the processing liquid discharged from the processing liquid supply nozzle on the processing surface is moved from the outer peripheral portion toward the central portion of the processing surface in a direction in which the X-axis extends, and the landing position of the processing liquid is set in a first one of two sections of the processing surface divided by the Y-axis while the landing position of the processing liquid is being moved from the outer peripheral portion toward the central portion of the processing surface, and the second liquid supply area is set in a second one of the two sections.

16. The substrate liquid processing apparatus of claim 8, wherein the processing surface is divided into four regions by linear X-axis and Y-axis passing through a rotation center of the processing surface and being orthogonal to each other, the landing position of the processing liquid discharged from the processing liquid supply nozzle on the processing surface is moved from the outer peripheral portion toward the central portion of the processing surface in a direction in which the X-axis extends, and the landing position of the processing liquid is set in a first one of two sections of the processing surface divided by the Y-axis while the landing position of the processing liquid is being moved from the outer peripheral portion toward the central portion of the processing surface, and the second liquid supply area is set in a second one of the two sections.

17. A substrate liquid processing method using the substrate liquid processing apparatus of claim 1, the method comprising:

moving, while discharging a liquid from a liquid supply nozzle toward a processing surface of a substrate being rotated and discharging a processing liquid in a form of mist from a processing liquid supply nozzle toward the processing surface, a landing position of the processing liquid on the processing surface on which a liquid film containing the liquid is formed from an outer peripheral portion toward a central portion of the processing surface.

* * * * *